United States Patent [19]
Xu et al.

[11] Patent Number: 5,841,624
[45] Date of Patent: Nov. 24, 1998

[54] COVER LAYER FOR A SUBSTRATE SUPPORT CHUCK AND METHOD OF FABRICATING SAME

[75] Inventors: Zheng Xu, Foster City; Fusen Chen, Cupertino; Jianming Fu, San Jose, all of Calif.

[73] Assignee: Applied Materials, Inc., Santa Clara, Calif.

[21] Appl. No.: 871,740

[22] Filed: Jun. 9, 1997

[51] Int. Cl.$^6$ ................................ H02N 13/00
[52] U.S. Cl. .......................... 361/234; 279/128
[58] Field of Search ................. 361/230, 233, 361/234; 279/128

[56] References Cited

U.S. PATENT DOCUMENTS

| | | | |
|---|---|---|---|
| 3,571,678 | 3/1971 | Sezako | 361/234 |
| 4,184,188 | 1/1980 | Briglia | 361/234 |
| 4,213,698 | 7/1980 | Firtion et al. | 355/77 |
| 4,384,918 | 5/1983 | Abe | 156/643 |
| 4,412,133 | 10/1983 | Eckes et al. | 361/234 |
| 4,480,284 | 10/1984 | Tojo et al. | 361/234 |
| 4,502,094 | 2/1985 | Lewin et al. | 361/234 |
| 4,520,421 | 5/1985 | Sakitani et al. | 361/234 |
| 4,551,192 | 11/1985 | Di Milia et al. | 156/345 |
| 4,897,171 | 1/1990 | Ohmi | 156/345 |
| 5,155,652 | 10/1992 | Logan et al. | 361/234 |
| 5,191,506 | 3/1993 | Logan et al. | 361/234 |
| 5,207,437 | 5/1993 | Barnes et al. | 361/234 |
| 5,413,360 | 5/1995 | Atari et al. | 279/128 |
| 5,522,131 | 6/1996 | Steger | 361/234 |
| 5,539,179 | 7/1996 | Nozawa et al. | 219/121.43 |
| 5,560,780 | 10/1996 | Wu et al. | 361/234 |
| 5,583,736 | 12/1996 | Anderson et al. | 361/234 |
| 5,656,093 | 8/1997 | Burkhart et al. | 361/234 |
| 5,745,332 | 4/1998 | Burkhart et al. | 361/234 |

FOREIGN PATENT DOCUMENTS

| | | |
|---|---|---|
| 0 439 000 B1 | 9/1994 | European Pat. Off. |
| 60-261377 | 12/1985 | Japan . |
| 61-56843 | 3/1986 | Japan . |
| 62-157752 | 7/1987 | Japan . |
| 63-194345 | 8/1988 | Japan . |
| 4-367247 | 12/1992 | Japan . |
| 5-243367 | 9/1993 | Japan . |
| 7-66271 | 3/1995 | Japan . |
| 7-74233 | 3/1996 | Japan . |

*Primary Examiner*—Fritz Fleming
*Attorney, Agent, or Firm*—Thomason and Moser

[57] ABSTRACT

A cover layer, and method of fabricating the same, for covering a support surface of a workpiece support. More specifically, the cover layer contains a plurality of conductive pads and an insulating material coating. The insulating material coating covers substantially the entire surface of the chuck; however, a top surface of each conductive pad is exposed through the coating. The cover layer maintains a wafer, or other workpiece, in a spaced apart relation to the support surface of the chuck. The distance between the underside surface of the wafer and the chuck is defined by the thickness of conductive pads in the cover layer. The plurality of conductive pads create a plurality of conductive paths from the wafer to the surface of the chuck such that the insulating material layer does not interfere with the Johnsen-Rahbek effect that electrostatically retains the wafer on the chuck.

20 Claims, 2 Drawing Sheets

COVER LAYER FOR A SUBSTRATE SUPPORT CHUCK AND METHOD OF FABRICATING SAME

BACKGROUND OF THE DISCLOSURE

1. Field of the Invention

The invention relates to a substrate support chuck within a semiconductor wafer processing system. More particularly, the invention relates to a cover layer for a substrate support chuck.

2. Description of the Background Art

Substrate support chucks are widely used to support substrates within a semiconductor processing system. A particular type of chuck used in high-temperature semiconductor processing systems, such as high-temperature physical vapor deposition (PVD), is a ceramic electrostatic chuck. These chucks are used to retain semiconductor wafers, or other workpieces, in a stationary position during processing. Such electrostatic chucks contain one or more electrodes imbedded within a ceramic chuck body. The ceramic material is typically aluminum-nitride, boron-nitride, or alumina doped with a metal oxide such as titanium oxide ($TiO_2$) or chromium-oxide or some other ceramic material with similar resistive properties. This form of ceramic is partially conductive at high temperatures.

In use, a wafer rests flush against the surface of the chuck body as a chucking voltage is applied to the electrodes. Because of the conductive nature of the ceramic material at high temperatures, the wafer is primarily retained against the ceramic support by the Johnsen-Rahbek effect. Such a chuck is disclosed in U.S. Pat. No. 5,117,121 issued May 26, 1992.

One disadvantage of using a chuck body fabricated from ceramic is that, during manufacture of the support, the ceramic material is "lapped" to produce a relatively smooth surface. Such lapping produces particles that adhere to the surface of the support. These particles are very difficult to completely remove from the surface. Additionally, the lapping process may fracture the surface of the chuck body. Consequently, as the chuck is used, particles are continuously produced by these fractures. Also, during wafer processing, the ceramic material can abrade the wafer oxide from the underside of the wafer resulting in further introduction of particulate contaminants to the process environment. During use of the chuck, the particles can adhere themselves to the underside of the wafer and be carried to other process chambers or cause defects in the circuitry fabricated upon the wafer. It has been found that tens of thousands of contaminant particles may be found on the backside of a given wafer after retention upon a ceramic electrostatic chuck.

Japanese Patent Application No. 60-261377, published Dec. 24, 1985, discloses a ceramic electrostatic chuck having an embossed support surface. The embossing reduces the surface area of the ceramic support that contacts the wafer. Consequently, the number of contaminant particles transferred to the wafer is reduced. However, such an embossed surface maintains some degree of contact between the ceramic material and the underside of the wafer. Thus, contamination, though reduced, is still substantial.

Similarly, substrate support chucks that are used in low-temperature processing (e.g., less than 300 degrees Celsius) may also produce contaminant particles that interfere with the wafer processing. Such low-temperature chucks include electrostatic chucks and mechanical clamping chucks which contain wafer support surfaces that are typically fabricated from dielectric materials such as alumina. These types of chucks have also been found to produce particular contaminants that can adhere to the underside of the wafer during processing.

Therefore, a need exists in the art for an apparatus that reduces the amount of contaminant particles that adhere to the underside of the wafer while supported upon a chuck.

SUMMARY OF THE INVENTION

The disadvantages of the prior art are overcome by the present invention of a cover layer for supporting a wafer, or other workpiece, in a spaced-apart relation to a chuck, or other workpiece support. More specifically, the invention is a cover layer disposed upon the support surface of the chuck. The cover layer contains a plurality of conductive pads and a coating of insulating material. The insulating material covers substantially the entire surface of the chuck; however, a top surface of each of the conductive pads is exposed through the coating. As such, a wafer, when placed upon the cover layer, contacts and is supported by the conductive pads.

The cover layer maintains a wafer, or other workpiece, in a spaced-apart relation to the support surface of the chuck. The distance between the underside surface of the wafer and the chuck is defined by the thickness of the conductive pads. The distance between the underside surface of the wafer and the surface of the insulating material coating should be larger than the expected diameter of contaminant particles that may lie on the surface of the cover layer. In this manner, the contaminant particles do not adhere to the underside of the wafer during processing.

The cover layer is fabricated by depositing the conductive pads on the chuck surface, coating the chuck surface and pads with an insulating material, and removing the insulating coating from the top surface of the pads to expose the conductive pads. More specifically, the conductive pads are fabricated by placing a mask or stencil on the surface of the substrate support chuck and depositing a conductive material upon the mask and chuck. The mask ensures that the conductive material is deposited in a pre-defined pattern such as a plurality of spaced-apart pads, radial strips, concentric rings, or a combination thereof. After deposition of the pads, the mask is removed and the insulating coating is deposited over the pads and chuck surface. The layer of insulating material is then partially removed by an etch-back technique or polishing process to expose the top surface of each conductive pad, i.e., the top surface of the conductive pads relative to the surface of the substrate support chuck. Thus, when a wafer is placed on the substrate support chuck having the cover layer of the present invention, the pads support the wafer above the chuck surface as well as provide a conductive path from the wafer to the ceramic chuck body.

As a result of using the invention during processing of semiconductor wafers, the number of particulate contaminants adhered to the underside of a wafer after processing has been reduced from tens of thousands of particles to hundreds of particles. This substantial improvement in particle count has significantly decreased the number of wafers that are found defective during processing. Additionally, at high temperatures, the Johnsen-Rahbek effect between substrate support chuck and wafer is maintained. Also, the insulating material layer isolates the ceramic from the atmosphere, thus blocking hydrocarbons and other contaminants from forming a conductive film upon the surface of the chuck.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
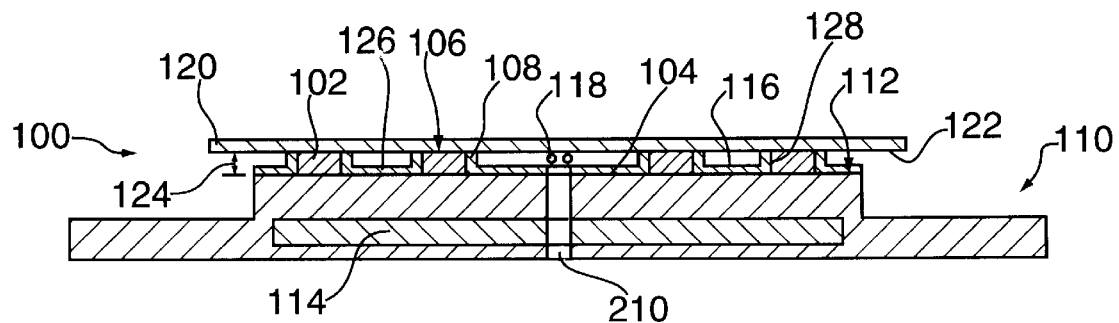
FIG. 1 depicts a cross-sectional view of a cover layer of the present invention, on the surface of a substrate support chuck, supporting a wafer.
Figure 2:
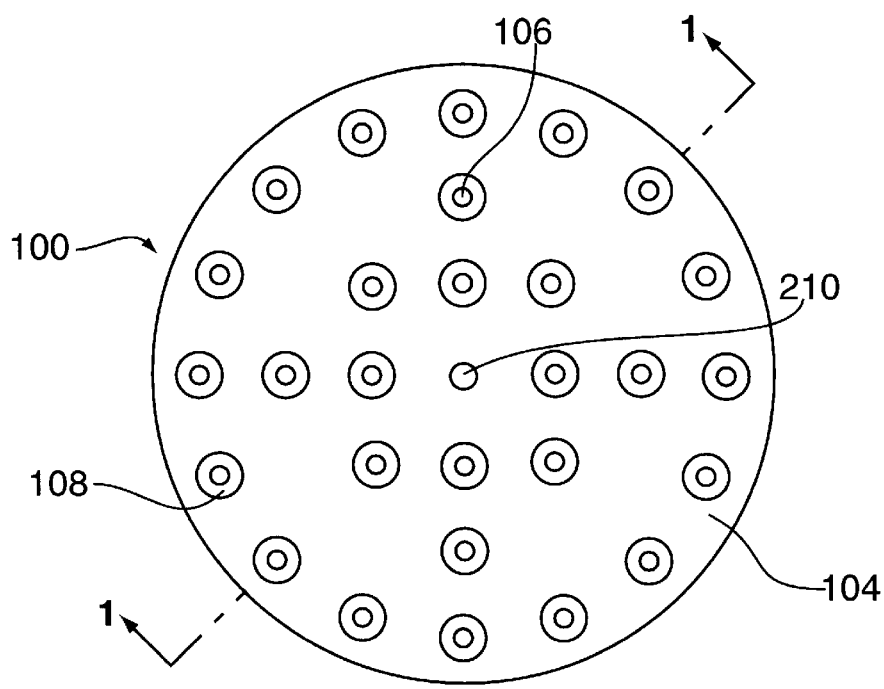
FIG. 2 depicts a top plan view of an illustrative pattern for the cover layer on the surface of a substrate support chuck.

FIG. 1 depicts a cross-sectional view of a cover layer 100 of the present invention disposed upon the surface of a substrate support chuck. The layer supports a wafer 120 above the surface 112 of the substrate support chuck 110. FIG. 2 depicts a top plan view of an illustrative pattern for the conductive pads 102 in the cover layer 100 of FIG. 1 (without the wafer 120). For best understanding of the invention, the reader should simultaneously refer to both FIGS. 1 and 2 while reading the following disclosure.

Although the preferred embodiment of the present invention is discussed as used in conjunction with a ceramic electrostatic chuck, the invention is also useful in supporting substrates above any form of chuck including non-ceramic electrostatic chucks, mechanical clamping chucks, and the like.

In the preferred embodiment, the electrostatic chuck 110 contains one or more electrodes 114 imbedded within a ceramic chuck body. The ceramic chuck body is, for example, fabricated of aluminum-nitride or boron-nitride. These materials are partially conductive (relatively low resistivity) at high temperatures. As such, during high temperature processing, the wafer is retained by the Johnsen-Rahbek effect. Other partially conductive ceramics also form useful high temperature chuck materials such as alumina doped with a titanium-oxide or a chromium-oxide. If the chuck is to be used at low temperatures only, then other ceramic and/or dielectric materials such as alumina are used to form the chuck body. An illustrative ceramic electrostatic chuck is disclosed in commonly assigned U.S. Pat. No. 5,511,799 issued Apr. 30, 1996, herein incorporated by reference. Examples of non-ceramic electrostatic chucks are disclosed in U.S. Pat. No. 4,184,188 issued Jan. 15, 1980 and U.S. Pat. No. 4,384,918 issued May 24, 1983, both of which are incorporated herein by reference.

The cover layer 100 is comprised of a plurality of conductive pads 102 positioned on the support surface 112 of the chuck 110. Typically, each conductive pad has a diameter of approximately 2 mm and a thickness of 2–5 μm, spaced equidistantly from one another and cover a range of 5% to 40% of the surface of the wafer. Preferably, the metallic material covers a range from 10% to 25% of the surface area of the chuck 110. Generally, the number, spacing and size of the pads are determined by the amount of clamping force applied by the electrostatic chuck. For example, if the amount of force is large and the pads are spaced relatively distant from one another, the wafer may bow between the pads.

In addition to the conductive pads, the cover layer 100 is also comprised of a coating of insulating material 104. The coating of insulating material covers substantially the entire surface of the chuck; however, a top surface 106 of each conductive pad 102 is exposed through the coating of insulating material. An illustrative thickness for the coating is approximately 0.8–1.0 μm. The insulating material coating blankets the surface of the substrate support chuck and the sides of each conductive pad.

Thus, when a wafer 120 is placed on the cover layer 100, the cover layer maintains the wafer 120 in a spaced-apart relation to the surface of the substrate support 112. The underside of the wafer 122 contacts the top surface 106 of each conductive pad 102 and a portion of insulating material 108 proximate each conductive pad 102. A distance 124 from the underside of the wafer 122 and the surface 112 of the chuck 110 is determined by the thickness of the conductive pads 102. A gap 126 between the underside surface of the wafer 122 and the surface 116 of the insulating material coating 104 should be larger than the expected diameter of contaminant particles 118 that may lie on the surface of the cover layer. Although the contaminant particles tend to become trapped in the gap 126, the cover layer 100 is easily cleaned to ensure that any surfaces that contact the wafer 120 are substantially free of contaminants.

To facilitate heat transfer from the wafer to the chuck body, a heat transfer medium, e.g., a gas such as helium, is pumped into the space 126 between the backside surface of the wafer 122 and the surface of the insulating material coating 104. This cooling technique is known as "backside cooling". The heat transfer medium is provided via a port 210 that is formed through the chuck 110 and cover layer 100. The medium is typically supplied to the underside of the wafer 122 at a rate of 2–30 sccm. The medium generally flows from the port 210 outward toward the edge of the wafer and escapes into the reaction chamber environment. Such backside cooling is well-known in the art and is disclosed, for example, in commonly assigned U.S. Pat. No. 5,228,501, issued to Tepman et al. on Jul. 20, 1993. Importantly, when backside cooling is used, the cover layer has a dual purpose: (1) to support the wafer to reduce backside particle adherence and (2) to create heat transfer medium distribution channels upon the support surface of the chuck. However, additional heat transfer medium distribution channels (not shown) may be formed in the surface of the chuck body to further aid distribution of the heat transfer medium across the underside of the wafer 122.

The key feature of the invention is that the wafer is supported in a spaced-apart relation to the surface of the chuck by conductive pads within the cover layer. The particular pad pattern is defined by a deposition (sputter) mask used in forming the pad pattern. The pattern is selected for the particular application of the chuck with consideration given to chucking voltage, chucking force, wafer thickness, the chuck electrode pattern, the particular process that the wafer is to be subjected and the like.

FIGS. 3A–3F depict the substrate support chuck 110 at each step of the process of fabricating the inventive cover layer 100. For best understanding of the inventive method of fabricating the cover layer, the reader should simultaneously refer to FIGS. 3A through 3F while reading the following disclosure.

Figure 3A:
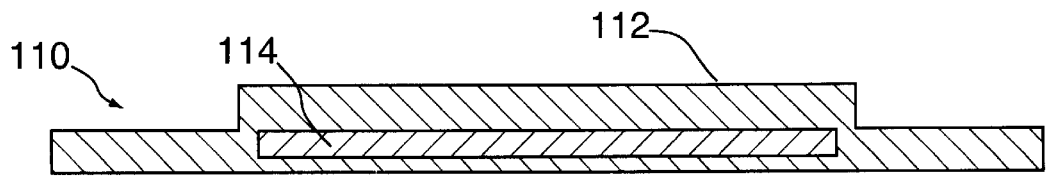
FIGS. 3A–3F depict the substrate support chuck at each step of a process of fabricating the inventive cover layer.
Figure 3B:
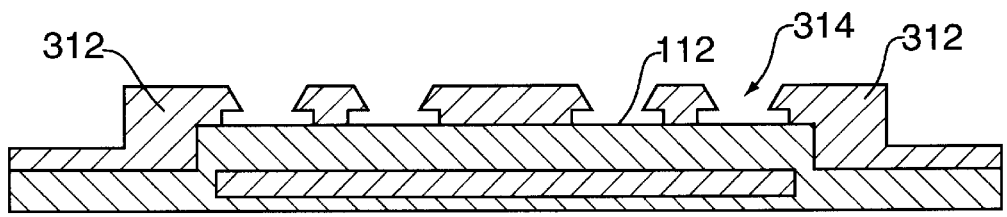

FIG. 3A depicts a substrate support chuck 110 prior to cover layer fabrication. FIG. 3B depicts the substrate support chuck 110 of FIG. 3A with a sputter mask 312 (or stencil) placed on the surface of substrate support chuck 112 for disposition of the conductive pads 102. Typically, a metal such as Tantalum, Titanium, Tungsten, Titanium-Nitride, or the like, is deposited upon the support surface 112 of the chuck body 110 by placing the sputter mask 312 on the support surface 112 during a deposition process. Furthermore, a combination of such metals can be deposited as a "double layer". For such a combination, a first metal, e.g., Titanium, is deposited on the support surface and stencil, then a second metal, e.g., Titanium-Nitride, is deposited onto the first metal.

An illustrative sputter mask is disclosed in commonly assigned U.S. patent application Ser. No. 08/736,887 filed Oct. 25, 1996, and incorporated by reference. The sputter mask contains a plurality of apertures 314 that define the location of the deposition upon the chuck surface 112. The conductive material is deposited, for example, using a physical vapor deposition (PVD) process or by using chemical vapor deposition (CVD) process, plasma spray deposition, brazing, flame spray deposition, and the like.

Figure 3C:
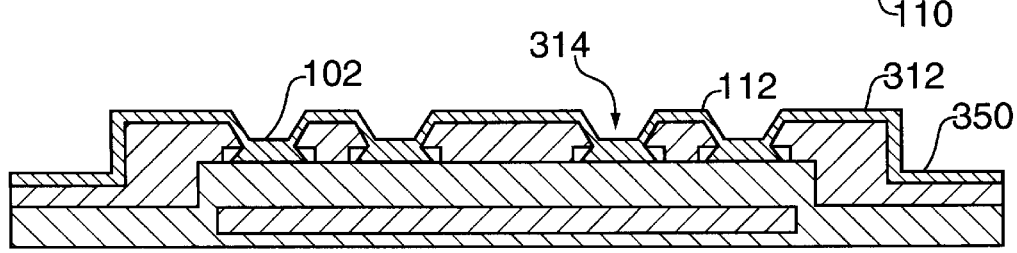
Figure 3D:
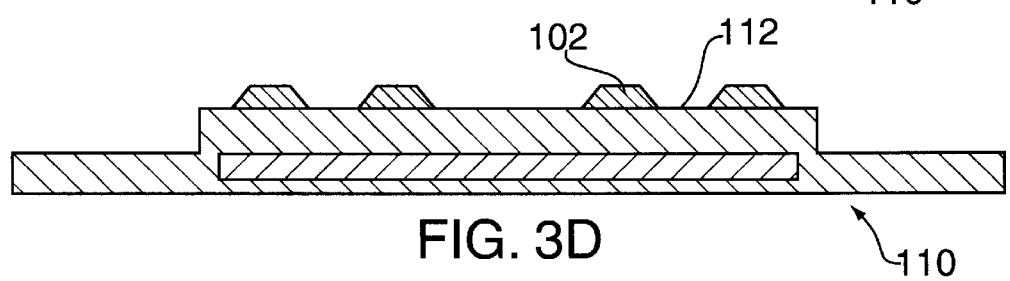

FIG. 3C depicts the sputter mask 312 on the surface 112 of the substrate support chuck 110 after the deposition of the conductive material (layer 350). The sputter mask is removed from the surface 112 of the substrate support chuck 110 exposing the conductive pads 102 on the surface 112 of the substrate support chuck 110, as depicted in FIG. 3D. The conductive material is deposited in a pre-defined pattern which is determined by apertures 314 of the sputter mask. Upon removal of the mask, conductive pads are left in the pre-defined pattern on the surface 112 of the substrate support chuck 110.

Figure 3E:
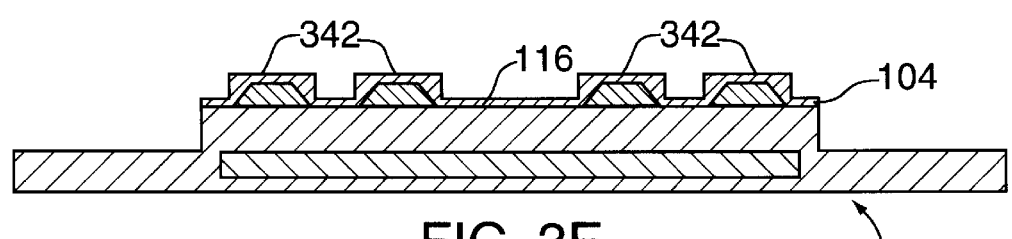

After removing the sputter mask 312, an insulating material 104 is deposited over the substrate support surface 112 and the conductive pads 102, forming an insulating material coating 104 depicted in FIG. 3E. The insulating material deposited is a material such as Silicon-Nitride ($Si_3N_4$), Silicon-Oxide ($SiO_2$), and the like. Furthermore, a combination of such insulating materials can be deposited in a "double layer". For such a combination, a first insulating material layer, e.g. $Si_3N_4$, is deposited on the support surface and the conductive pads, then a second insulating material layer, e.g., $SiO_2$, is deposited onto the first insulating material layer. The insulating material is typically blanket-deposited using a chemical vapor deposition (CVD) process, or other such method. The insulating material coating 104 is typically 1.0 $\mu$m thick.

The insulating material coating 104 above the conductive material (i.e., at locations 342) is thinned using an etch-back technique or a polishing technique (e.g., a chemical-mechanical polishing (CMP) process) to remove the insulating material 104 and expose the top surface 106 of each conductive pad 102.

Alternatively, instead of blanket-depositing the insulating material 104, the insulating material can be selectively deposited between the conductive pads using a masking technique such that the top surface 106 of each conductive pad 102 is exposed without using a etch-back or polishing step.

Figure 3F:
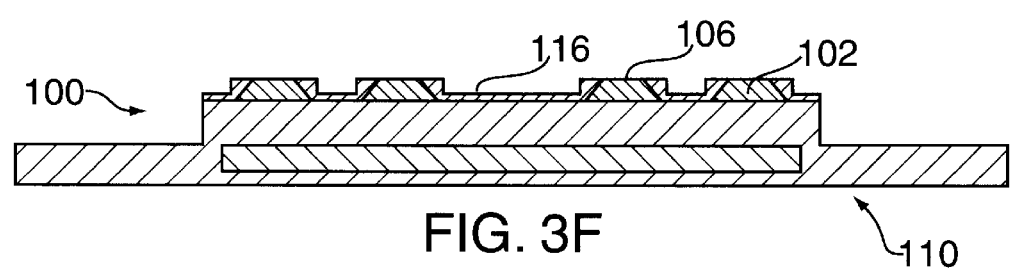

FIG. 3F depicts the substrate support chuck 110 with the inventive cover layer 100. Thus, when a wafer is placed on the substrate support chuck having the present invention, the wafer contacts, and is supported by, the cover layer in a spaced-apart and substantially parallel relation to the surface of the substrate support.

Using the cover layer of the present invention on the surface of a ceramic chuck has resulted in substantially decreased particulate contamination of wafers. Empirical data shows that a conventional ceramic chuck supporting a wafer directly upon its support surface can transfer tens of thousands of particles to the underside of a wafer. However, using the cover layer of the present invention reduces the particle count for particles located on the underside of a wafer to hundreds of particles. Importantly, the cover layer does not significantly interfere with the clamping process or impact the clamping force, such as the Johnsen-Rahbek effect, that retains the wafer upon the chuck.

Additionally, the cover layer also isolates the ceramic chuck from the atmosphere. Empirical data shows that the cover layer reduces atmospheric organic contamination experienced by the surface of the chuck. Without such isolation of the chuck surface, a conductive film has been known to grow on the surface of a ceramic chuck. Over time, this film interferes with and degrades the chucking force. Use of the present invention ensures that the atmosphere does not contact the ceramic chuck surface; thus, extending the life of the chuck.

Furthermore, the addition of a dielectric material within the space between the chuck surface and the underside of the wafer increases the chucking force. For example, the chucking force (F) due to the Johnsen-Rahbek effect is known to be given by $$F = K\epsilon'S \frac{V^2}{t^2}$$

where:
K is a constant;
$\epsilon'$ is a dielectric constant of the space between the wafer and chuck surface;
t is the length of the space between the wafer and the chuck surface;
V is the voltage drop across the space; and
S is the surface area of the chuck.

Assuming a vacuum in the space of thickness t, the dielectric constant is $\epsilon_o$. When the cover layer is used, the dielectric constant of the space becomes $$\epsilon' = \frac{\alpha_0 \epsilon}{\epsilon - \alpha(\epsilon - \epsilon_0)}$$

where:
$\epsilon$ is the dielectric constant of the insulating material of the cover layer; and
$\alpha$ is the percentage of the space thickness that is filled by the insulating material.

Since the dielectric constant of $S_iO_2$ or $S_{i3}N_4$ is approximately $4\epsilon_o$, then $\epsilon' > \epsilon_o$ and the chucking force generated using an insulating is increased over the chucking force of a chuck that does not use an insulating layer.

Although various embodiments which incorporate the teachings of the present invention have been shown and described in detail herein, those skilled in the art can readily devise many other varied embodiments that still incorporate these teachings.

What is claimed is:

1. A cover layer for covering a support surface of a workpiece support chuck comprising:
    a plurality of conductive pads contacting said support surface, where each of the conductive pads has a top surface; and
    an insulating material coating covering said support surface and exposing said top surface of each of said conductive pads, said insulating material coating and said conductive pads being patterned for supporting a workpiece in a spaced-apart relation to the support surface of the workpiece support chuck.

2. The cover layer of claim 1 wherein said plurality of conductive pads are metallic.

3. The cover layer of claim 1 wherein a material for fabricating the conductive pads is selected from the group consisting of Tantalum, Titanium, Tungsten, and Titanium-Nitride.

4. The cover layer of claim 1 wherein each of the conductive pads comprises a plurality of layers, where the material for each layer is selected from the group consisting of Tantalum, Titanium, Tungsten, and Titanium-Nitride.

5. The cover layer of claim 1 wherein a material for fabricating the insulating material coating is Silicon Nitride.

6. The cover layer of claim 1 wherein a material for fabricating the insulating material coating is Silicon Oxide.

7. The cover layer of claim 1 wherein the insulating material coating comprises a plurality of layers containing a first Silicon Nitride layer and a second Silicon Oxide layer.

8. An apparatus comprising:

a workpiece support chuck, having a support surface; and a cover layer for covering the support surface of the workpiece support chuck, said cover layer comprising:

a plurality of conductive pads contacting said support surface, where each pad has a top surface; and an insulating material coating covering said support surface and not covering said top surface of said plurality of conductive pads, said insulating material coating and said conductive pads patterned for supporting a workpiece in a spaced-apart relation to the support surface of the workpiece support chuck.

9. The cover layer of claim 8 wherein said plurality of conductive pads are metallic.

10. The cover layer of claim 8 wherein a material for fabricating the conductive pads is selected from the group consisting of Tantalum, Titanium, Tungsten, and Titanium-Nitride.

11. The cover layer of claim 8 wherein each of said conductive pads comprises a plurality of layers of material selected from the group consisting of Tantalum, Titanium, Tungsten, and Titanium-Nitride.

12. The cover layer of claim 8 wherein a material for fabricating the insulating material coating is Silicon Nitride.

13. The cover layer of claim 8 wherein a material for fabricating the insulating material coating is Silicon Oxide.

14. The cover layer of claim 8 wherein the insulating material coating comprises a combination layer having a first Silicon Nitride layer and a second Silicon Oxide layer.

15. The apparatus of claim 8 wherein the workpiece support chuck comprises an electrostatic chuck having a ceramic chuck body.

16. A method of fabricating a cover layer for covering a support surface of a workpiece support chuck, comprising the steps of:

depositing a conductive material to form a plurality of conductive pads to contact the support surface of the workpiece support chuck, each conductive pad of said plurality of conductive pads having a top surface; and depositing an insulating material coating, covering the support surface and not covering the top surface of the plurality of conductive pads.

17. The method of claim 16 wherein the insulating materials is deposited over the support surface and the conductive pads, and the method further comprises the step of:

removing said insulating material coating from said top surface of each conductive pad.

18. The method of claim 17 wherein said removing step further comprises the step of selectively etching the insulating material from the top surface of each of the conductive pads.

19. The method of claim 17 wherein said removing step further comprises the step of polishing the insulating material from the top surface of each of the conductive pads.

20. The method of claim 16 wherein the insulating material is deposited using a deposition mask to avoid deposition upon the top surface of the plurality of conductive pads.

* * * * *